United States Patent
Yin et al.

(10) Patent No.: US 8,541,280 B2
(45) Date of Patent: Sep. 24, 2013

(54) SEMICONDUCTOR STRUCTURE AND METHOD FOR MANUFACTURING THE SAME

(75) Inventors: Haizhou Yin, Poughkeepsie, NY (US); Zhijiong Luo, Poughkeepsie, NY (US); Huilong Zhu, Poughkeepsie, NY (US)

(73) Assignee: The Institute of Microelectronics, Chinese Academy of Sciences, Beijing (CN)

( * ) Notice: Subject to any disclaimer, the term of this patent is extended or adjusted under 35 U.S.C. 154(b) by 94 days.

(21) Appl. No.: 13/380,654

(22) PCT Filed: Apr. 18, 2011

(86) PCT No.: PCT/CN2011/072912
§ 371 (c)(1),
(2), (4) Date: Dec. 23, 2011

(87) PCT Pub. No.: WO2012/041056
PCT Pub. Date: Apr. 5, 2012

(65) Prior Publication Data
US 2013/0001555 A1    Jan. 3, 2013

(30) Foreign Application Priority Data

Sep. 29, 2010 (CN) .......................... 2010 1 0296962

(51) Int. Cl.
H01L 21/336    (2006.01)
(52) U.S. Cl.
USPC .......................................... 438/299; 438/655
(58) Field of Classification Search
USPC ................. 438/299, 300, 655; 257/384
See application file for complete search history.

(56) References Cited

U.S. PATENT DOCUMENTS

| | | | |
|---|---|---|---|
| 5,899,741 A * | 5/1999 | Tseng et al. ................ | 438/649 |
| 2002/0096726 A1 | 7/2002 | Koike | |
| 2010/0109046 A1 | 5/2010 | Mehandru et al. | |

FOREIGN PATENT DOCUMENTS

| | | |
|---|---|---|
| CN | 1365146 | 8/2002 |
| CN | 1734747 | 2/2006 |
| JP | 3640079 B2 | 4/2005 |
| JP | 2006024809 | 1/2006 |

OTHER PUBLICATIONS

Office Action dated May 15, 2013 from The State Intellectual Property Office of the People's Republic of China in counterpart Chinese application No. 201010296962.8.
International Preliminary Report on Patentability and Written Opinion issued in corresponding International Patent Application No. PCT/CN2011/072912 dated Apr. 11, 2013.

* cited by examiner

Primary Examiner — Mark Prenty
(74) Attorney, Agent, or Firm — Morgan, Lewis & Bockius LLP

(57) ABSTRACT

The present invention provides a method for manufacturing a semiconductor structure, comprising the steps of: depositing an interlayer dielectric layer (105) on a semiconductor substrate (101) to cover a source/drain region (102) and a gate stack on the semiconductor substrate (101); etching the interlayer dielectric layer and the source/drain region, so as to form a contact hole (110) extending into the source/drain region; conformally forming an amorphous layer (111) on an exposed part of the source/drain region; forming a metal silicide layer (113) on a surface of the amorphous layer (111); and filling the contact hole (110) with a contact metal (114). Correspondingly, the present invention further provides a semiconductor structure. The present invention etches the source/drain region so that the exposed part comprises the bottom and a sidewall, thereby expanding the contact area between the contact metal in the contact hole and the source/drain region, and reducing the contact resistance. The present invention effectively eliminates EOR defects caused by the amorphous ion implantation by forming an amorphous substance by a selective deposition.

11 Claims, 3 Drawing Sheets

SEMICONDUCTOR STRUCTURE AND METHOD FOR MANUFACTURING THE SAME

CROSS REFERENCE TO RELATED APPLICATION

This application is a National Phase application of PCT Application No. PCT/CN2011/072912, filed on Apr. 18, 2011, entitled "semiconductor structure and method for manufacturing the same", which claimed priority to Chinese Application No. 201010296962.8, filed on Sep. 29, 2010. Both the PCT Application and the Chinese Application are incorporated herein by reference in their entireties.

FIELD OF THE INVENTION

This invention relates to a technology of semiconductor manufacturing, and particularly to a semiconductor structure and a method for manufacturing the same.

BACKGROUND OF THE INVENTION

With the development of the semiconductor industry, integrated circuits with higher performances and stronger functions require a larger element density. In addition, the sizes of various components/elements or the spaces between them need to be further reduced. Accordingly, the contact area between the source/drain region and the metal electrode is decreased. As the contact resistivity between the contact surfaces of the conventional source/drain region and the metal electrode is larger, such decreased contact area causes an obvious increase of the contact resistance.

In the prior art, a US patent application US2010/0109046A1 provides a method for decreasing the contact resistance of a source/drain region, so as to solve the above problem and improve the conductivity of the source/drain region. The method comprises the steps of:

performing a pre-decrystallizatoin process on the source/drain region via a contact hole in a manner of ion implantation, so as to form a local amorphous silicon region;

performing a doping ion implantation to the source/drain region using boron;

then plating a layer of metal on an amorphous region at the bottom of the contact hole;

performing an annealing, so that a reaction is caused at the portion of the metal contacting the amorphous silicon to form a metal silicide layer, below which there is residual unreacted amorphous silicon;

next, removing the excess metal which is not siliconized and filling a metal electrode.

Since there is a transition from the amorphous silicon layer to the metal silicide between the source/drain region and the metal electrode, the resistivity between the source/drain region and the metal electrode can be effectively reduced, thereby decreasing the contact resistance.

However, although the above method can decrease the contact resistance of the source/drain region, quite a few defects may be caused by performing the ion implantation and then the annealing during the decrystallizatoin process. For example, when the re-crystallization annealing is ended, the End-of-Range (EOR) defects may occur in a region closely adjacent to a lower region of the recrystallization layer. These EOR defects are generated by crystal defects, and they occur in the decrystallizatoin step while develop in the recrystallization step. These EOR defects seriously deteriorate the electrical properties, especially the carrier mobility of the substrates, and as a result, it is unsuitable to manufacture electronic elements with these substrates. Moreover, in the prior art, the metal silicide is only formed at the bottom of the contact hole, and with the decrease of the device size, a bottom area of the contact hole is reduced, which increases the contact resistance. Therefore, under the tendency that the semiconductor device size becomes smaller, it becomes a problem urgently to be solved to effectively increase the contact area of the semiconductor while reducing the contact resistance.

SUMMARY OF THE INVENTION

The object of the present invention is to provide a semiconductor structure and a method for manufacturing the same, which are beneficial to the reduction the contact resistance.

According to one aspect of the present invention, a method for manufacturing a semiconductor structure is provided, the method comprising the steps of:

depositing an interlayer dielectric layer on a semiconductor substrate to cover a source/drain region and a gate stack on the semiconductor substrate;

etching the interlayer dielectric layer and the source/drain region, so as to expose a part of the source/drain region and form a contact hole extending into the source/drain region;

conformally forming an amorphous layer on the exposed part of the source/drain region;

forming a metal silicide layer on a surface of the amorphous layer; and filling the contact hole with a contact metal.

According to another aspect of the present invention, a semiconductor structure is provided, comprising:

a semiconductor substrate;

a gate stack formed on the semiconductor substrate;

a source/drain region formed in the semiconductor substrate;

an interlayer dielectric layer covering both the gate stack and the source/drain region;

a contact hole penetrating through the interlayer dielectric layer and extending into the source/drain region; and a contact metal filling the contact hole;

wherein a metal silicide layer is conformally formed between a portion of the contact metal extending into the source/drain region and the source/drain region on sidewalls and bottom of that portion.

As compared with the prior art, the present invention has the following advantages:

The exposed part of the source/drain region comprises the bottom and the sidewalls by etching the source/drain region, which increases the contact area between the contact metal and the source/drain region in the contact hole, and reduces the contact resistance. This invention conformally forms an amorphous layer on the exposed part of the source/drain region, instead of forming the amorphous substance by amorphous ion implantation, as a result, it is beneficial to the reduction of EOR defects caused by the amorphous ion implantation and thus reduce the leakage current.

BRIEF DESCRIPTION OF THE DRAWINGS

Other features, objects and advantages of the present invention will become more apparent by reading the detailed descriptions of the non-restrictive embodiments made in reference to the following drawings.

Figure 1:
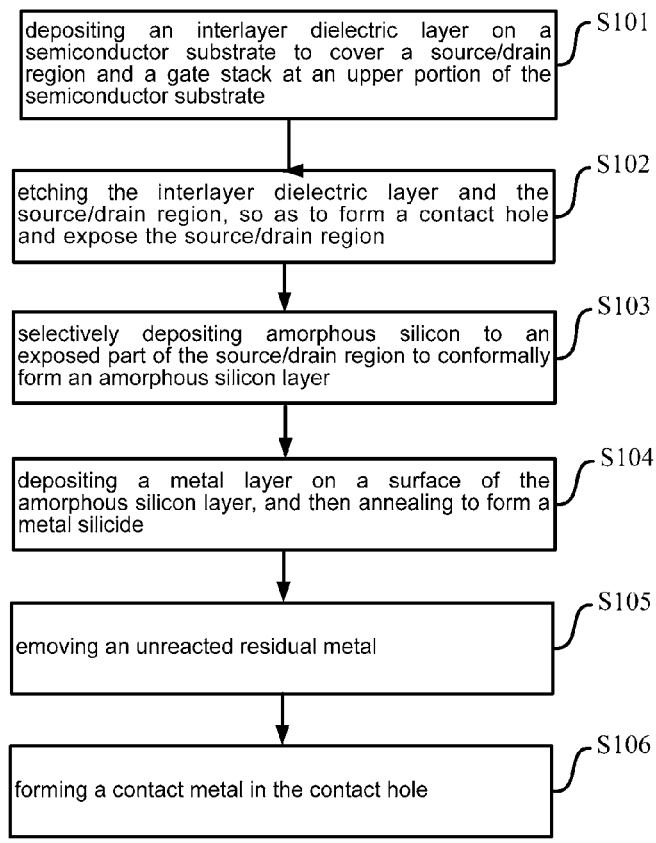
FIG. 1 is a flowchart of a method for manufacturing a semiconductor structure according to the present invention.

The same or similar reference signs in the drawings represent the same or similar components.

DETAILED DESCRIPTION OF THE PREFERRED EMBODIMENTS

The embodiments of the present invention are described in detail as follows. The examples of the embodiments are illustrated in the drawings, throughout which the same or similar reference signs represent the same or similar elements or elements having the same or similar functions. The embodiments described as follows with reference to the drawings are exemplary, and are merely used to interpret the present invention, rather than limiting the present invention.

The following disclosure provides many different embodiments or examples to implement different structures of the present invention. In order to simplify the disclosure of the present invention, the components and arrangements of specific examples are described in the following text. Apparently, they are just exemplary, and do not intend to restrict the present invention. In addition, reference numbers and/or letters can be repeatedly used in different examples of the present invention for the purposes of simplification and clearness, without indicating the relationships between the discussed embodiments and/or arrangements. Furthermore, the present invention provides examples of various specific processes and materials, but a person skilled in the art can realize the availability of other processes and/or usage of other materials. Moreover, a structure described as follows in which a first feature is "on" a second feature, may include an embodiment where the first and second features are formed to directly contact with each other, or an embodiment where another feature is formed between the first and second features so that the first and second features may not directly contact with each other. To be noted, the components as illustrated in the drawings are not always drawn on the scale. In the present invention, the descriptions of the known assemblies as well as treatment technologies and processes are omitted, so as to avoid any unnecessary restriction to the present invention.

Referring to FIGS. 1 and 2A to 2E, FIG. 2A is a cross-sectional schematic view of a semiconductor structure formed before the steps in FIG. 1. The semiconductor structure comprises: a semiconductor substrate 101; a gate stack formed on the semiconductor substrate 101 and having a gate dielectric layer 104 and a metal gate layer 103; spacers 106 formed on sidewalls of the gate stack; and source/drain regions 102 on both sides of the gate stack. Next, in step S101 of FIG. 1, an interlayer dielectric layer 105 is deposited on the semiconductor substrate 101, and the interlayer dielectric layer 105 covers the source/drain regions 102 and the gate stack (including the gate dielectric layer 104 and the metal gate layer 103) disposed at an upper portion of the semiconductor substrate 101, as illustrated in FIG. 2. In this embodiment, the semiconductor substrate 101 comprises a silicon substrate (e.g., a wafer). According to the known design requirement of the prior art (e.g., a P-type substrate or an N-type substrate), the semiconductor substrate 101 may include various doped configurations. The semiconductor substrate 101 of other example may further comprise other basic semiconductor such as germanium. Or the semiconductor substrate 101 may comprise compound semiconductors, such as silicon carbide, gallium arsenide, indium arsenide or indium phosphide. Typically, the semiconductor substrate 101 may be, but not limited to, about several hundreds of microns thick, e.g., of a thickness ranging from about 400 um to 800 um.

The source/drain region 102 may be formed by implanting P-type or N-type dopants or impurities into the semiconductor substrate 101. For example, with regard to the PMOS, the source/drain region 102 may be P-type doped SiGe, and with regard to the NMOS, the source/drain region 102 may be N-type doped Si. The source/drain region 102 may be formed by a method that comprises photoetching, ion implantation, diffusion and/or other suitable processes, and may be formed before the gate dielectric layer. In this embodiment, the source/drain region 102 may be a raised source/drain structure formed through a selective growth, and a top 107 of its epitaxial portion is higher than the bottom of the gate stack (in this specification, the bottom of the gate stack refers to a boundary of the gate stack and the semiconductor substrate 101).

The gate stack comprises the gate dielectric layer 104 and the metal gate layer 103. The gate dielectric layer 104 is disposed on the semiconductor substrate 101, and it may be a thermal oxide layer comprising silicon oxide and silicon oxynitride, or a high dielectric constant (high-K) dielectric such as one of $HfO_2$, HfSiO, HfSiON, HfTaO, HfTiO, HfZrO, $Al_2O_3$, $La_2O_3$, $ZrO_2$ and LaAlO, or combinations thereof. The gate dielectric layer 104 may have a thickness of about 2 nm to 10 nm, such as 5 nm or 8 nm. Next, the metal gate layer 103 is formed on the gate dielectric layer 104, e.g., by depositing one of TaC, TiN, TaTbN, TaErN, TaYbN, TaSiN, HfSiN, MoSiN, $RuTa_x$ and $NiTa_x$, or combinations thereof, and the thickness thereof may be about 10 nm to 80 nm, such as 30 nm or 50 nm. Particularly, spacers 106 are formed on two sidewalls of the gate to separate the gates. The spacer 106 may be formed of silicon nitride, silicon oxide, silicon oxynitride or silicon carbide, or combinations thereof, and/or other appropriate materials. The spacer 106 may have a multi-layer structure. The spacer 106 may be formed through processes including deposition-etching, with a thickness of about 10 nm to 100 nm, such as 30 nm, 50 nm or 80 nm.

The interlayer dielectric layer 105 may be formed on the semiconductor substrate 101 through chemical vapor deposition (CVD), high density plasma CVD, spin coating or other appropriate method, so as to cover the raised source/drain region 102, the gate and the spacers 106. The interlayer dielectric layer 105 may comprise doped or undoped silica glass, SiON or other low K materials. The interlayer dielectric layer 105 may have a thickness of about 40 nm to 150 nm, such as 80 nm, 100 nm or 120 nm.

Figure 2A:
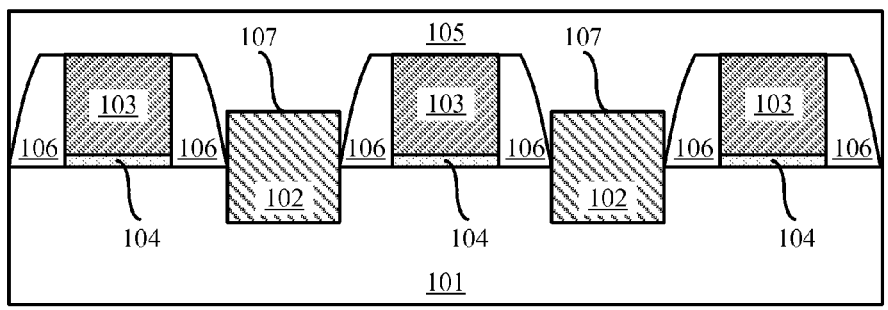
FIGS. 2A to 2E are cross-sectional schematic views of a semiconductor structure at respective stages, wherein the semiconductor structure is manufactured in the flow as illustrated in FIG. 1 according to a preferred embodiment of the present invention.
Figure 2B:
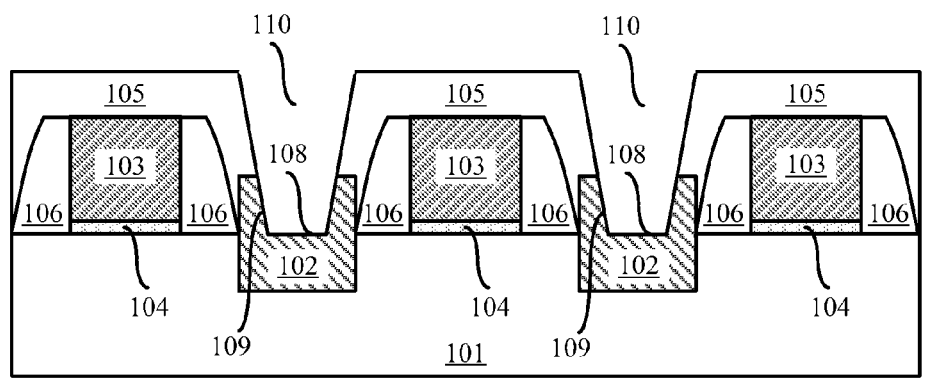

Next, step S102 is performed by etching the interlayer dielectric layer 105 and the source/drain region 102, so as to expose a part of the source/drain region 102 and form a contact hole 110 extending into the source/drain region 102, as illustrated in FIG. 2B. The formed interlayer dielectric layer 105 and the source/drain region 102 are partially etched to form a contact hole opening 110. In case the raised source/drain region is adopted, the etching may be performed till the raised portion of the source/drain region, i.e., the etch depth in the source/drain region is controlled to be flushed with the bottom of the gate stack (in this specification, the term "flush" means that a height difference therebetween is within an allowed process error range). The solution adopts the raised source/drain region to relieve the channel region stress, which is beneficial to minimizing the stress loss caused by the etching operation on the source/drain region while reducing the contact resistance. In other embodiment, the etching may also be performed till a surface of the exposed source/drain region being above or below the bottom of the gate stack. In order to accurately control the etch depth of the source/drain region, an etching stop layer (e.g., silicon of about 5nm thick) may be formed at a position in the source/drain region flushed with the bottom of the gate stack, and then the lifted portion of the source/drain region is formed on the etching stop layer. With regard to the PMOS, the portion in the source/drain region lower than the gate stack may be SiGe, the etching stop layer may be a silicon layer, the raised portion of the source/drain region may be SiGe, and each of those portions is P-type doped. With regard to the NMOS, the portion in the source/drain region lower than the gate stack may be silicon or SiC, the etching stop layer may be a silicon layer, the epitaxial portion of the source/drain region may be SiGe, and each of those portions is N-type doped.

The contact hole 110 formed by etching may have a conical structure with a big top and a small bottom. The source/drain region 102 exposed by the contact hole 110 comprises the bottom 108 of the contact hole 110 and a part of the sidewall 109 extending from the bottom. With regard to the raised source/drain region, the bottom 108 and the bottom of the gate dielectric layer 104 may be located in the same horizontal plane. When the raised portion of the raised source/drain region 102 is etched, the contact area between the exposed part of the raised source/drain region 102 and the metal silicide will be effectively increased, thereby reducing the contact resistance. During the etching of the contact hole, a dry etching is generally adopted.

With regard to the non-raised source/drain region 102, its top and the gate dielectric layer are located in the same horizontal plane. The source/drain region may also be etched in the aforementioned way to form an exposed part having bottom and sidewall structures to expand the contact area. Next, an amorphous layer 111 may be formed in the method as described for the raised source/drain region 102 and then doped, so as to construct other embodiments of the method of the present invention.

Figure 2C:
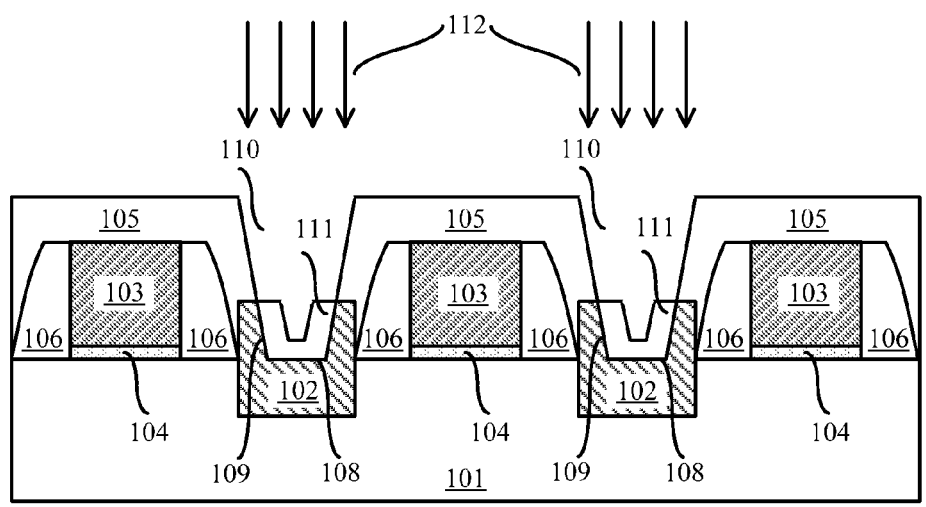

In step S 103, an amorphous layer 111 is conformally formed by selectively depositing an amorphous substance to the exposed part of the source/drain region 102, as illustrated in FIG. 2C. According to the detailed applications, the amorphous layer 111 may be amorphous silicon, amorphous SiGe or amorphous SiC. Generally speaking, when the source/drain region 102 is made of one of silicon, SiGe and SiC, the amorphous substance to be deposited will be accordingly selected as one of amorphous silicon, amorphous SiGe and amorphous SiC. The deposition method may be physical vapor deposition (PVD), chemical vapor deposition (CVD), or atomic layer deposition (ALD), etc. The amorphous substance is selectively deposited to form the amorphous layer 111 on the bottom 108 and the sidewall 109 exposed by the source/drain region 102. Herein forming the amorphous layer 111 with the deposition method instead of the ion implantation method has the following advantages: the deposition method can conformally form the amorphous layer 111 evenly on the bottom and the sidewall of the contact hole; while the ion implantation method generally has a directivity and can only form the amorphous layer 111 on the bottom of the contact hole 110, or the amorphous layer 111 formed at the bottom is thicker than that formed on the sidewall. In addition, as described above, forming the amorphous layer 111 through the ion implantation will cause quite a few defects. Therefore, the present invention preferably adopts the deposition method to form the amorphous layer 111.

Herein, the "conformally" means that the amorphous layer 111 has a uniform thickness and the same shapes as the bottom and sidewall of the contact hole 110. The thickness of the amorphous layer 111 is generally about 10 nm to 30 nm, such as 15 nm, 20 nm or 25 nm.

In addition to forming the amorphous layer 111 using the deposition process, optionally, the amorphous layer 111 may also be formed on the bottom and sidewall of the exposed part of the raised source/drain region 102 by an epitaxial growth process. In detail, at the same time of the epitaxial growth, the gas source may be doped with gases containing doping elements such as arsenic, boron, carbon or phosphorus, which is beneficial to the reduction of the resistivity of the amorphous layer 111, thus when the contact hole is formed thereon and filled with the metal to form a contact plug, it is beneficial to the reduction of the contact resistance between the contact plug and the source/drain region 102.

After step S103 is performed, optionally, a doping ion implantation 112 may be carried out from the contact hole opening 110 to the amorphous layer 111. In detail, with regard to the N-type semiconductor device, the elements of group III such as Boron and indium may be used for the ion implantation. With regard to the P-type semiconductor device, the elements of group V such as arsenic and phosphorus may be used for the ion implantation. The available ion implantation energy range is about 3 keV to 25 keV, the dosage is about 1e14 to 2e15, and the implantation depth range is about 10 nm to 30 nm. In which, the process parameters during the ion implantation are related to the thickness of the amorphous layer 111 and the type of the implanted ion, thus a person skilled in the art may flexibly select suitable process parameters according to the above teaching.

Particularly, for the non-raised source/drain region, the amorphous layer 111 may be deposited thereon before the interlayer dielectric layer 105 is formed. The deposition may be performed through the PVD, CVD or ALD process, or the amorphous layer 111 may be formed through an epitaxial growth. After the contact hole is formed, it may be embedded in the amorphous layer 111. By forming the amorphous layer 111 as a transition layer between the contact hole and the source/drain region, it is beneficial to the reduction of the contact resistance between the contact plug and the source/drain region. In which, the composition and thickness of the amorphous layer 111 are the same as those in the previous embodiment, and herein are not repeated.

Figure 2D:
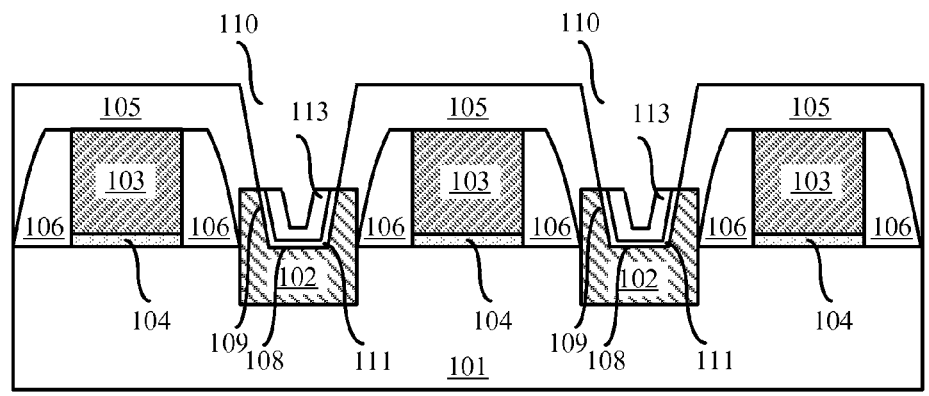

Next, step S104 is performed by depositing a metal layer on the surface of the amorphous layer 111, and then annealing to form a metal silicide 113, as illustrated in FIG. 2D. Firstly, a metal layer is evenly formed on the bottom and sidewall of the amorphous layer 111 through a metal sputtering or the CVD method. The metal may be Ni or other feasible metal, such as Ti, Co or Cu. Next, the semiconductor structure is annealed, and other annealing processes such as rapid thermal annealing or spike annealing may be adopted in other embodiments. According to the embodiments of the present invention, the device is generally annealed in an instant annealing process, e.g., a microsecond laser annealing is carried out under a temperature over about 1000° C. to form a metal silicide 113 at the portion of the deposited metal layer contacting the amorphous layer 111, wherein the thickness of the amorphous layer 111 is larger than that of the amorphous silicon consumed to form the metal silicide 113. That is to say, the metal silicide 113 is completely formed within the amorphous layer 111, and the amorphous layer 111 is residual as a transition layer between the metal silicide 113 and the source/drain region 102, which is beneficial to the reduction of the contact resistance between the contact plug and the source/ drain region 102. Next, in step S 105, the residual metal not joining the reaction to form the metal silicide is removed by a selective etching.

Figure 2E:
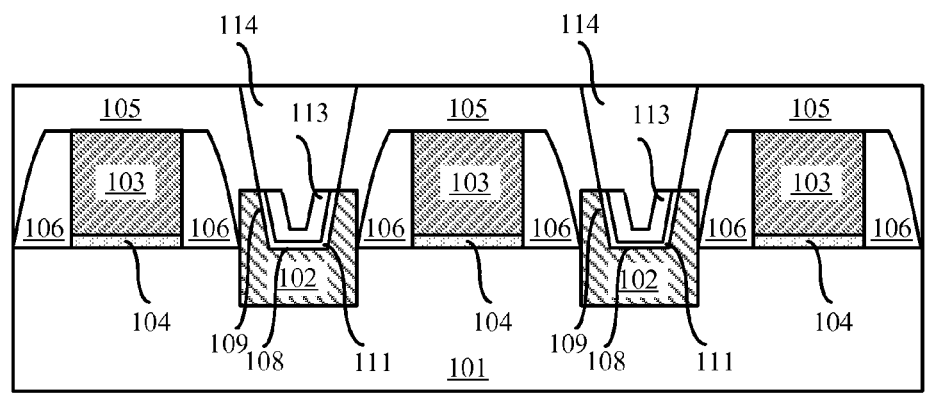

Finally, as illustrated in FIG. 2E, in step S 106, a contact metal 114 is formed through a deposition in the contact hole 110, and then the contact hole 110 is filled. The contact metal may be made of a metal, such as W, TiAl or Al, etc, or an alloy thereof. Before the contact metal is formed, a liner may be deposited on the entire inner wall and bottom of the contact hole 110 through a deposition process such as ALD, CVD and PVD. The liner may be made of a material of Ti, TiN, Ta or TiN, or any combination thereof. The liner may have a thickness of about 5 nm to 20 nm, such as 10 nm or 15 nm.

Subsequently, the semiconductor device is manufactured in the steps of the conventional semiconductor manufacturing process.

After the above steps are finished, the contact metal 114 is connected to the source/drain region through the metal silicide 113 and the amorphous silicon, the amorphous SiC or the amorphous SiGe, thereby reducing the contact resistivity of the interface. In addition, since its area in contact with the source/drain region comprises not only an area of the bottom of the contact hole 110 but also an area of a part of the sidewall, the contact area is increased, thus the resistance between the contact metal and the source/drain region is wholly reduced, which is beneficial to the improvement of the performance of the semiconductor device. In addition, the deposition process adopted during the formation of the amorphous layer 111 effectively reduces the EOR defects.

In order to more clearly understand the semiconductor structure formed according to the aforementioned method for manufacturing the same, FIG. 2E is described as follows in conjunction with FIG. 2D, wherein FIG. 2D is the cross-sectional schematic view of the semiconductor structure before the contact hole 110 is filled with the contact metal.

Referring to FIG. 2E, which is the cross-sectional schematic view of the semiconductor structure finally formed after the steps as illustrated in FIG. 1 being completed. The semiconductor structure comprises: a semiconductor substrate 101; a gate stack formed on the semiconductor substrate 101 and having a gate dielectric layer 104 and a metal gate layer 103; spacers 106 formed on sidewalls of the gate stack; source/drain regions 102 formed on both sides of the gate stack; an interlayer dielectric layer 105 covering both the gate stack and the source/drain regions 102; and a contact hole 110 penetrating through the interlayer dielectric layer 105 and extending into the source/drain region 102, wherein the contact hole 110 is filled with a contact metal 114, and the portion thereof extending into the source/drain region 102 conformally forms a metal silicide 113 with the source/drain region 102 on a part of the sidewall 109 and the bottom 108.

In one embodiment, the source/drain region 102 may be a raised source drain structure, i.e., the top of the source/drain region 102 is higher than the bottom of the gate stack. In that case, the bottom of the contact hole 110 is flushed with the bottom of the gate stack.

The amorphous layer 111 is formed between the metal silicide 113 and the source/drain region 102. In which, the metal silicide 113 is formed in a reaction between the metal and the amorphous layer 111. The amorphous layer 111 may be formed in a selective deposition process or an epitaxial growth process. In addition, the amorphous layer 111 may be made of one of amorphous silicon, amorphous SiGe and amorphous SiC, or combinations thereof. The material of the contact metal 114 may be one of W, TiAl alloy and Al, or combinations thereof.

In order to control the depth of the contact hole 110 in the source/drain region 102, an etching stop layer may be reserved when the source/drain region 102 is formed, and the etching stop layer is made of a material different from that of other portions in the source/drain region 102. When the contact hole 110 is formed by etching, the depth of the contact hole 110 stops at the etching stop layer.

When the source/drain region 102 uses the raised source drain structure, the etching stop layer is preferably to be flushed with the bottom of the gate stack. Preferably, the material of the etching stop layer is silicon. A portion in the source/drain region 102 above the etching stop layer is made of SiGe.

In which, the structure component, material and manufacturing method for each part in the embodiments of the semiconductor device may be the same as those in the aforementioned embodiments of the method for manufacturing the semiconductor device, and therefore are not repeated here. Although the exemplary embodiments and their advantages have been detailedly described herein, it shall be appreciated that various changes, substitutions and modifications may be made to these embodiments without deviating from the spirit of the present invention and the protection scopes defined by the accompanied claims. With respect to other examples, it shall be easily understood by a person skilled in the art that the sequence of the process steps may be changed while maintaining the protection scope of the present invention.

Furthermore, the application scope of the present invention is not limited to the processes, structures, manufacturing, compositions, means, methods and steps of the specific embodiments as described in the specification. According to the disclosure of the present invention, a person skilled in the art will easily understood that, when the processes, structures, manufacturing, compositions, means, methods and steps currently existing or to be developed in future are adopted to perform functions substantially the same as corresponding embodiments described in the present invention, or achieve substantially the same effects, a person skilled in the art can make applications of them according to the present invention. Therefore, the accompanied claims of the present invention intend to include the processes, structures, manufacturing, compositions, means, methods and steps within its protection scope.

What is claimed is:

1. A method for manufacturing a semiconductor structure, comprising:
   depositing an interlayer dielectric layer (105) on a semiconductor substrate (101) to cover a source/drain region (102) and a gate stack on the semiconductor substrate (101);
   etching the interlayer dielectric layer (105) and the source/drain region (102), so as to expose a part of the source/drain region (102) and form a contact hole (110) extending into the source/drain region (102);
   conformally forming an amorphous layer (111) on the exposed part of the source/drain region (102);
   forming a metal silicide layer (113) on a surface of the amorphous layer (111); and
   filling the contact hole (110) with a contact metal (114).

2. The method according to claim 1, wherein
   the amorphous layer (111) is conformally formed by a selective deposition process or an epitaxial growth process.

3. The method according to claim 1, wherein
   the amorphous layer (111) has a thickness larger than a portion thereof used for forming the metal silicide layer.

4. The method according to claim 1, wherein the amorphous layer is one of amorphous silicon, amorphous SiGe and amorphous SiC.

5. The method according to claim 1, wherein after conformally forming the amorphous layer (111), the method further comprises implanting doping ions into the amorphous layer (111).

6. The method according to claim 1, wherein the exposed part of the source/drain region (102) comprises the bottom of the contact hole (110) and a part of the sidewall extending from the bottom.

7. The method according to claim 1, wherein the source/drain region (102) is a raised source/drain region.

8. The method according to claim 1, wherein the contact metal (114) is made of one of W, TiAl alloy and Al, or combinations thereof.

9. The method according to claim 1, wherein
the source/drain region (102) comprises an etching stop layer made of a material different from that of other portions in the source/drain region.

10. The method according to claim 9, wherein
the etching stop layer is flushed with the bottom of the gate stack.

11. The method according to claim 9, wherein
the etching stop layer is made of silicon; and
a portion in the source/drain region above the etching stop layer is made of SiGe.

\* \* \* \* \*